US011222925B2

(12) United States Patent
Ren et al.

(10) Patent No.: US 11,222,925 B2
(45) Date of Patent: Jan. 11, 2022

(54) ARRAY SUBSTRATE, METHOD FOR FABRICATING THE SAME USING FILTER AND SELF-EMISSION TECHNOLOGIES, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Jun Ren, Beijing (CN); Xiao Fu, Beijing (CN); Qinghua Zou, Beijing (CN)

(73) Assignees: HEFEI XINSHENG OPTOELECTRONICS TECHNOLOGY CO., LTD., Hefei (CN); BOE TECHNOLOGY GROUP CO., LTD, Beijing (CN)

( * ) Notice: Subject to any disclaimer, the term of this patent is extended or adjusted under 35 U.S.C. 154(b) by 379 days.

(21) Appl. No.: 16/334,811

(22) PCT Filed: Aug. 30, 2018

(86) PCT No.: PCT/CN2018/103346

§ 371 (c)(1),
(2) Date: Mar. 20, 2019

(87) PCT Pub. No.: WO2019/109682

PCT Pub. Date: Jun. 13, 2019

(65) Prior Publication Data

US 2020/0013832 A1 Jan. 9, 2020

(51) Int. Cl.
*H01L 29/20* (2006.01)
*H01L 27/32* (2006.01)
*H01L 51/56* (2006.01)

(52) U.S. Cl.
CPC ...... *H01L 27/3211* (2013.01); *H01L 27/3216* (2013.01); *H01L 51/56* (2013.01); *H01L 27/322* (2013.01)

(58) Field of Classification Search
CPC ......................... H01L 27/3211; H01L 27/3216
See application file for complete search history.

(56) References Cited

U.S. PATENT DOCUMENTS 9,704,930 B2 * 7/2017 Wang .................... H01L 27/322
10,134,824 B2 * 11/2018 Yan ...................... H01L 27/322
(Continued)

FOREIGN PATENT DOCUMENTS

CN 104103672 10/2014
CN 104717773 A 6/2015
(Continued)

OTHER PUBLICATIONS

Chinese Office Action for 201711268171.2 dated Jul. 10, 2020.
International Search Report, PCT/CN2018/103346, dated Nov. 21, 2018.

*Primary Examiner* — Caleb E Henry
(74) *Attorney, Agent, or Firm* — Arent Fox LLP; Michael Fainberg

(57) ABSTRACT

This disclosure discloses an array substrate, a method for fabricating the same, and a display device. The array substrate includes: a base substrate; and a plurality of pixel elements located on one side of the base substrate, wherein each of the pixel elements includes: a pixel light-emitting layer, and at least two different color filters located on the side of the pixel light-emitting layer away from the base substrate; the pixel light-emitting layer includes a first sub-pixel light-emitting layer and a second sub-pixel light-emitting layer; and in the same pixel element, an orthographic projection of each of the filters onto the base
(Continued)

05 05 04_1 04_2 01 05 02 031 032 03

0321 0322 05 02 031 substrate has an overlap area with an orthographic projection of the second sub-pixel light-emitting layer onto the base substrate.

12 Claims, 7 Drawing Sheets

(56) References Cited

U.S. PATENT DOCUMENTS

| | | | | |
|---|---|---|---|---|
| 10,229,956 | B2 * | 3/2019 | Hack | H01L 51/56 |
| 10,243,023 | B2 * | 3/2019 | Hack | H01L 51/5265 |
| 10,340,315 | B2 * | 7/2019 | Shim | H01L 27/322 |
| 10,374,017 | B2 * | 8/2019 | Hack | H01L 51/5012 |
| 2014/0183471 | A1 * | 7/2014 | Heo | H01L 51/504<br>257/40 |
| 2016/0254323 | A1 | 9/2016 | Wang et al. | |
| 2018/0097184 | A1 * | 4/2018 | Lee | C07D 401/12 |
| 2018/0286929 | A1 | 10/2018 | Li et al. | |
| 2018/0375027 | A1 * | 12/2018 | Zhang | H01L 51/0011 |

FOREIGN PATENT DOCUMENTS

| | | | |
|---|---|---|---|
| CN | 104766875 | A | 7/2015 |
| CN | 105027313 | | 11/2015 |
| CN | 105428390 | | 3/2016 |
| CN | 106935624 | A | 7/2017 |
| CN | 107154420 | | 9/2017 |
| JP | 2007178899 | | 7/2007 |
| JP | 2014032372 | A | 2/2014 |

* cited by examiner

ARRAY SUBSTRATE, METHOD FOR FABRICATING THE SAME USING FILTER AND SELF-EMISSION TECHNOLOGIES, AND DISPLAY DEVICE

CROSS-REFERENCES TO RELATED APPLICATIONS

This application is a US National Stage of International Application No. PCT/CN2018/103346, filed Aug. 30, 2018, which claims priority to Chinese Patent Application No. 201711268171.2, filed with the Chinese Patent Office on Dec. 5, 2017, and entitled "Array substrate, method for fabricating the same, and display device", which is hereby incorporated by reference in its entirety.

FIELD

This disclosure relates to the field of display technologies, and particularly to an array substrate, a method for fabricating the same, and a display device.

BACKGROUND

An Organic Light-Emitting Diode (OLED) display panel has been increasingly widely applied due to its high contrast, wide color gamut, high response speed, flexibility, and other excellent characteristics. At present, sub-pixels in the OLED display panel are generally fabricated by fabricating the sub-pixels in respective colors using a Fine Metal Mask (FFM) and through evaporation so that the sub-pixels in the respective different colors emit light in their corresponding colors through self-emission. As the required resolution of the display panel is growing, it is more difficult to fabricating the fine metal mask required for the sub-pixels. Due to the technical limitation, the fine metal mask cannot meet the required precision of the display panel with a higher resolution, so it is difficult to improve the resolution of the display panel including the sub-pixels fabricated in this way. Furthermore while the sub-pixels are being fabricated, there may be a color crosstalk because an opening of the fine metal mask is not accurately aligned, the fine metal mask is deformed, etc., thus degrading the quality of the product.

SUMMARY

An embodiment of this disclosure provides an array substrate. The array substrate includes: a base substrate; and a plurality of pixel elements located on one side of the base substrate, wherein each of the pixel elements includes: a pixel light-emitting layer, and at least two different color filters located on a side of the pixel light-emitting layer away from the base substrate; the pixel light-emitting layer includes a first sub-pixel light-emitting layer and a second sub-pixel light-emitting layer, and in a same pixel element, an orthographic projection of each of the color filters onto the base substrate has an overlap area with an orthographic projection of the second sub-pixel light-emitting layer onto the base substrate.

Optionally in the array substrate above according to the embodiment of this disclosure, the second sub-pixel light-emitting layer includes a white sub-pixel light-emitting layer or a yellow sub-pixel light-emitting layer.

Optionally in the array substrate above according to the embodiment of this disclosure, when the second sub-pixel light-emitting layer includes the yellow sub-pixel light-emitting layer, the yellow sub-pixel light-emitting layer includes a yellow host material and a yellow dopant material; or the yellow sub-pixel light-emitting layer includes a red emitting material and a green emitting material, where the red emitting material includes a red host material and a red dopant material, and the green emitting material includes a green host material and a green dopant material.

Optionally in the array substrate above according to the embodiment of this disclosure, the first sub-pixel light-emitting layer is a blue sub-pixel light-emitting layer.

Optionally in the array substrate above according to the embodiment of this disclosure, the filters include a red color filter and a green color filter.

Optionally in the array substrate above according to the embodiment of this disclosure, orthographic projections of the filters onto the base substrate do not overlap with each other.

Optionally in the array substrate above according to the embodiment of this disclosure, in the same pixel element, the orthographic projection of the second sub-pixel light-emitting layer onto the base substrate covers the orthographic projection of each of the filters onto the base substrate.

Optionally in the array substrate above according to the embodiment of this disclosure, the first sub-pixel light-emitting layer is arranged at a same layer as the second sub-pixel light-emitting layer.

Optionally in the array substrate above according to the embodiment of this disclosure, the array substrate further includes: a first electrode layer located between the filters and the second sub-pixel light-emitting layer, and a second electrode layer located between the base substrate and the second sub-pixel light-emitting layer.

Optionally in the array substrate above according to the embodiment of this disclosure, the array substrate further includes an optical coupling layer located between the first electrode layer and the filters.

Optionally in the array substrate above according to the embodiment of this disclosure, the array substrate further includes: an electron injection layer located between the first electrode layer and the second sub-pixel light-emitting layer, an electron transport layer located between the electron injection layer and the second sub-pixel light-emitting layer, a hole injection layer located between the second electrode layer and the second sub-pixel light-emitting layer, and a hole transport layer located between the hole injection layer and the second sub-pixel light-emitting layer.

Optionally in the array substrate above according to the embodiment of this disclosure, the array substrate further includes an optical adjusting layer located between the second sub-pixel light-emitting layer and the hole transport layer.

An embodiment of this disclosure further provides a display device including the array substrate according to the embodiment of this disclosure.

An embodiment of this disclosure further provides a method for fabricating an array substrate. The method includes: forming a pixel light-emitting layer in each pixel element on a base substrate, wherein the pixel light-emitting layer includes a first sub-pixel light-emitting layer and a second sub-pixel light-emitting layer; and forming at least two different color filters on a side of the pixel light-emitting layer away from the base substrate in each pixel element, wherein in a same pixel element, an orthographic projection of each of the filters onto the base substrate has an overlap area with an orthographic projection of the second sub-pixel light-emitting layer onto the base substrate.

DETAILED DESCRIPTION

Figure 1:
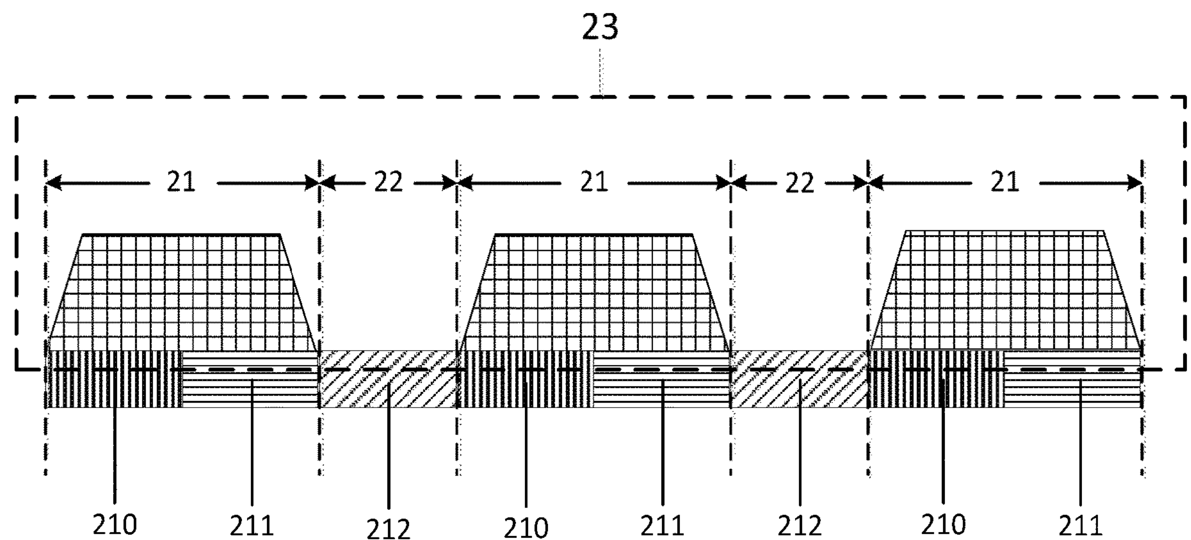
FIG. 1 is a schematic structural diagram of fabricating sub-pixels using a fine metal mask in the related art.

In order to make the objects, the technical solutions, and the advantages of this disclosure more apparent, implementations of the array substrate, the method for fabricating the same, and the display device according to the embodiments of this disclosure will be described below in details with reference to the drawings. It shall be appreciated that the preferable embodiments to be described below are only intended to illustrate and explain this disclosure, but not intended to limit this disclosure thereto. Furthermore the embodiments of this disclosure, and the features in the embodiments can be combined with each other unless they conflict with each other. It shall be noted that the thicknesses and the shapes of respective layers in the drawings are not intended to reflect any real proportion of the array substrate, but only intended to illustrate this disclosure. Furthermore identical or like reference numerals throughout the drawings will refer to identical or like elements, or elements with identical or like functions.

The shapes and the sizes of respective components in the drawings are not intended to reflect any real proportion, but only intended to illustrate this disclosure.

Referring to FIG. 1, for example, sub-pixels in respective colors are fabricated using a fine metal mask and through vapor-deposition, that is, the sub-pixels in the respective different colors emit light in their corresponding colors through self-emission. Specifically an array substrate includes three color sub-pixels, which are red sub-pixels, blue sub-pixels, and green sub-pixels. In FIG. 1, 210 refers to an area in which the red sub-pixels are to be formed, 211 refers to an area in which the blue sub-pixels are to be formed, and 212 refers to an area in which the green sub-pixels are to be formed. Taking the green sub-pixels as an example, when the green sub-pixels are formed through evaporation using a fine metal mask 23, the area 210 in which the red sub-pixels are to be formed and the area 211 in which the blue sub-pixels are to be formed in the array substrate are shielded using the fine metal mask 23, and the area 212 to be evaporated in which the green sub-pixels are to be formed are exposed. The fine metal mask 23 includes an opening area 22 and a shielding area 21, where the shielding area 21 of the fine metal mask 23 is an area for shielding the area 210 in which the red sub-pixels are to be formed, and the area 211 in which the blue sub-pixels are to be formed, and the opening area 22 of the fine metal mask 23 is an area for exposing the area 212 to be evaporated in which the green sub-pixels are to be formed. In an evaporated process, the green sub-pixels are formed in the area 212 in which the green sub-pixels are to be formed, through the opening area 22. Correspondingly the red sub-pixels and the green sub-pixels are formed respectively under the same principle of forming the green sub-pixels, so that the self-emitting sub-pixels in the three different colors are formed. As the resolution of the array substrate is growing, the size of the opening area 22 as required is decreasing, so it is more difficult to fabricate the array substrate. On the other hand, in order to fabricate the sub-pixels using a fine metal mask, the sub-pixels in each color shall be fabricated using at least one fine metal mask, and in order to enable the area in which the sub-pixels are to be formed, to be exposed accurately in the opening area of the fine metal mask, the opening of the fine metal mask shall be aligned precisely. However while the opening is being aligned, a color crosstalk tends to occur between the sub-pixels in the different colors, so the quality of the product can also be improved by reducing the number of times the fine metal mask is used.

Figure 2:
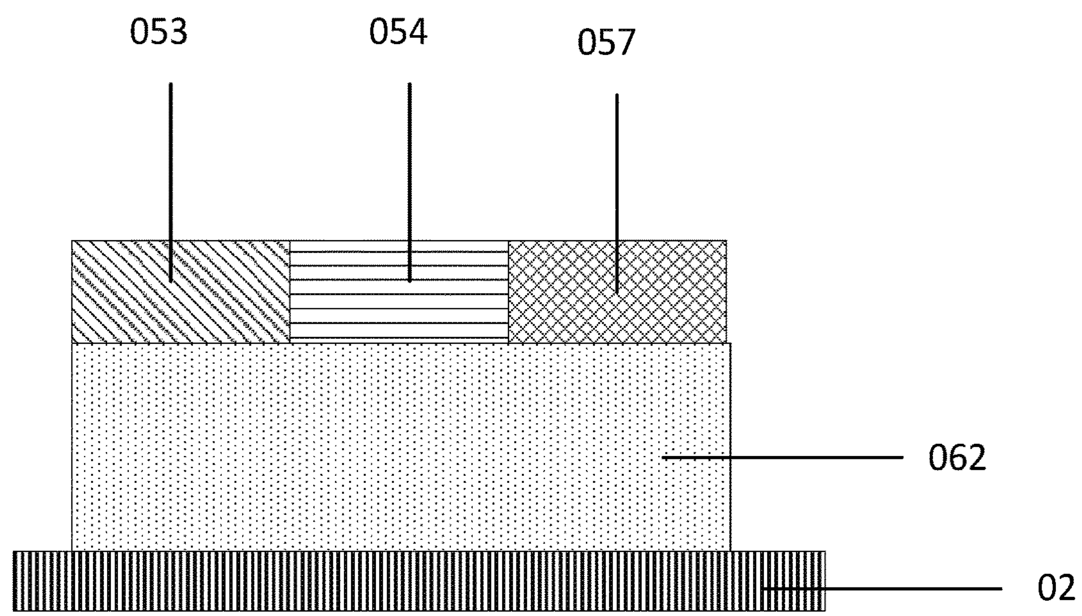
FIG. 2 is a schematic structural diagram of fabricating sub-pixels using filters in the related art.

At present, the sub-pixels in the respective different colors can alternatively emit light using filters, that is, filters in a plurality of different colors are arranged to extract light in the respective colors. Referring to FIG. 2, the sub-pixels in the respective different colors emit light using color filters as follows: the array substrate includes sub-pixels in three colors, which are red sub-pixels, blue sub-pixels, and green sub-pixels. A white sub-pixel light-emitting layer 062 is arranged on a base substrate 02, and a red color filter 053, a green color filter 054, and a blue color filer 057 are arranged on the white sub-pixel light-emitting layer 062 to extract different colors of light corresponding to the filters from white light emitted from the white sub-pixel light-emitting layer 062. Since a process of fabricating a filer is matured, the areas of the filters in the respective colors can be made smaller, so it is easy to improve the resolution of the display panel fabricated using the filters. On the other hand, however, the transmittance of the blue color filter is typically low, so the blue light shall be extracted with high power consumption.

Figure 3:
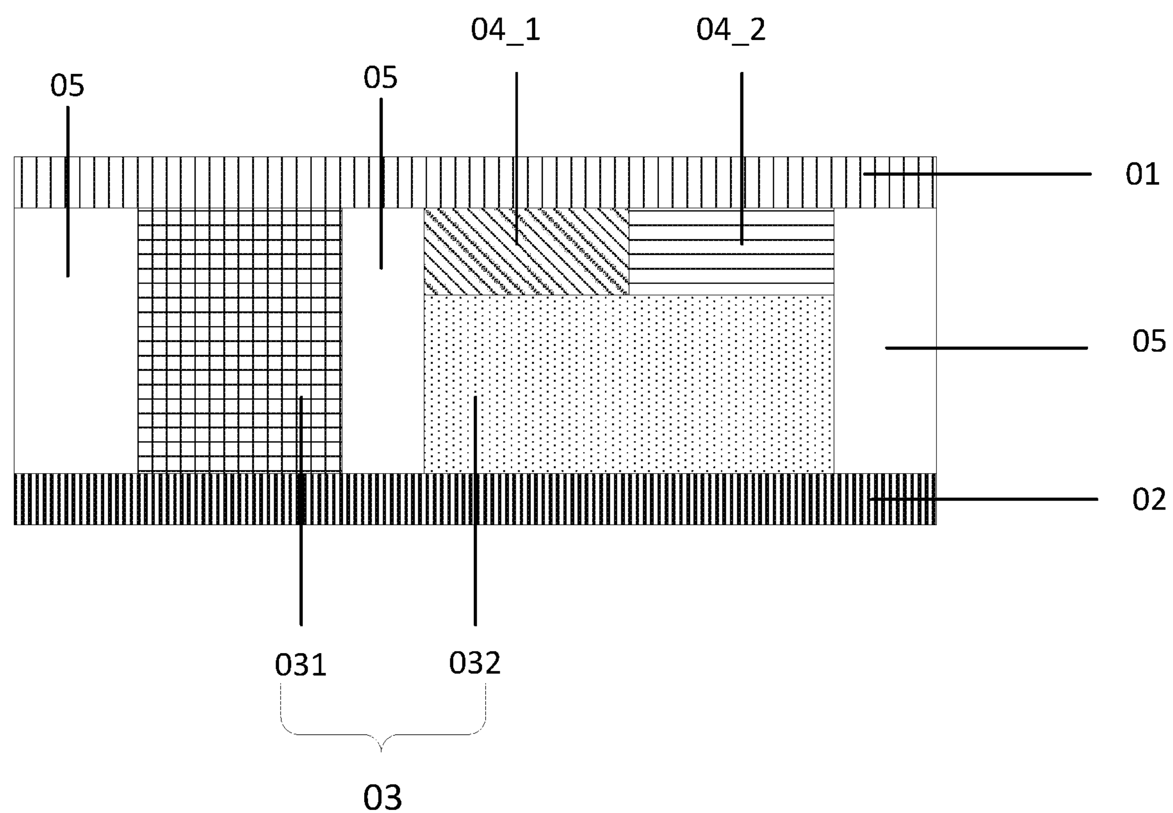
FIG. 3 is a first schematic structural diagram of an array substrate according to an embodiment of this disclosure.

In view of this, an embodiment of this disclosure provides an array substrate. As illustrated in FIG. 3, the array substrate can include: a base substrate 02, and a plurality of pixel elements located on one side of the base substrate 02. Each of the pixel elements can include: a pixel light-emitting layer 03, and at least two different color filters 04_*m* ($1 \le m \le M$, and m is an integer, where M represents the total number of colors of the filters, and for example, M=2 as illustrated in FIG. 3) located on the side of the pixel light-emitting layer 03 away from the base substrate 02. The pixel light-emitting layer 03 includes at least a first sub-pixel light-emitting layer 031 and a second sub-pixel light-emitting layer 032. In the same pixel element, an orthographic projection of each of the filters 04_*m* onto the base substrate

02 has an overlap area with the orthographic projection of the second sub-pixel light-emitting layer 032 onto the base substrate 02.

In the array substrate above according to the embodiment of this disclosure, by using the filters, the resolution of the array substrate is improved, and the probability that a color crosstalk between the sub-pixels while the array substrate is being fabricated is lowered, to thereby lower the difficulty of the fabricating process of the array substrate, and improve the product quality of the array substrate. Furthermore the power consumption of the array substrate is lowered through self-emission to thereby prolong the service lifetime of the array substrate, and to provide the array substrate with both a high definition and lower power consumption.

Optionally in a specific implementation, in the array substrate above according to the embodiment of this disclosure, as illustrated in FIG. 3, the orthographic projection of each of the filters 04_1 and 04_2 onto the base substrate 02 may not overlap with another. Furthermore in the same pixel element, the orthographic projection of the second sub-pixel light-emitting layer 032 onto the base substrate 02 may cover the orthographic projections of each of the filters 04_*m* onto the base substrate 02, where in the same pixel element, the area of the orthographic projection of the second sub-pixel light-emitting layer 032 onto the base substrate 02 may be larger than the sum of the areas of the orthographic projections of the color filter 04_1 and the color filter 04_2 onto the base substrate 02, and the second sub-pixel light-emitting layer 032 emits light in its own color through self-emission, to form the pixel with its color in the area of the orthographic projection of the second sub-pixel light-emitting layer 032 onto the base substrate 02 other than the sum of the areas of the orthographic projections of the color filter 04_1 and the color filter 04_2 onto the base substrate 02. Of course, the area of the orthographic projection of the second sub-pixel light-emitting layer 032 onto the base substrate 02 may alternatively be equal to the sum of the areas of the orthographic projections of the color filter 04_1 and the color filter 04_2 onto the base substrate 02, although the embodiment of this disclosure will not be limited thereto.

In a specific implementation, in the array substrate above according to the embodiment of this disclosure, the first sub-pixel light-emitting layer and the second sub-pixel light-emitting layer emits light in different colors, and the colors of the filters in the same pixel element are also different. The color of light corresponding to the first sub-pixel light-emitting layer can be light in a color with a lower transmittance of an element extracting the light in the color filter technique, e.g., blue light, that is, the first sub-pixel light-emitting layer can be a blue sub-pixel light-emitting layer. Since there is a lower transmittance of an element extracting blue light (e.g., a blue color filter) among the color filters, blue light is extracted by the blue color filter with higher power consumption, so blue light is emitted by a blue sub-pixel through self-emission to thereby improve the luminous efficiency of the blue sub-pixel, and lower the power consumption of the array substrate. Of course, the first sub-pixel light-emitting layer 031 may alternatively be another color pixel light-emitting layer as needed in reality without departing from the spirit of this disclosure, although the embodiment of this disclosure will not be limited thereto.

In a specific implementation, in the array substrate above according to the embodiment of this disclosure, two different color filters, i.e., the filter 04_1 and the filter 04_2, can be arranged in each pixel element. In this way, the first sub-pixel light-emitting layer 031 and second sub-pixel light-emitting layer 032, which are self-emitting, can be arranged on the base substrate 02, and the filter 04_1 and the filter 04_2 are arranged on the self-emitting second sub-pixel light-emitting layer 032, so that the filter 04_1 and the filter 04_2 extract light in the color corresponding to the color filter 04_1, and light in the color corresponding to the color filter 04_2 from light emitted from the second sub-pixel light-emitting layer 032. As compared with the use of a fine metal mask, the areas of the filters in the respective colors can be made smaller, so the filter 04_1 and the filter 04_2 are arranged on the second sub-pixel light-emitting layer 032 to extract the light in the color corresponding to the color filter 04_1, and the light in the color corresponding to the color filter 04_2, so that the array substrate can be provided with a higher resolution. Alternatively in a specific implementation, three different color filters can be arranged in each pixel element to extract the corresponding colors of light corresponding to the three color filters from light emitted from the second sub-pixel light-emitting layer 032, to thereby form three color sub-pixels corresponding to the three color filters. Of course, more different color filters can alternatively be arranged as needed in reality, although the embodiment of this disclosure will not be limited thereto.

Furthermore in the array substrate above according to the embodiment of this disclosure, only the two color sub-pixel light-emitting layers including the first sub-pixel light-emitting layer 031 and the second sub-pixel light-emitting layer 032 needs to be evaporated to thereby reduce the number of times a fine metal mask is used, and the number of times the fine metal mask is aligned precisely while the fine metal mask is being used, so as to lower the probability that a color crosstalk may occur between the pixels while the array substrate is being fabricated, and to improve the product quality of the array substrate.

Figure 4A:
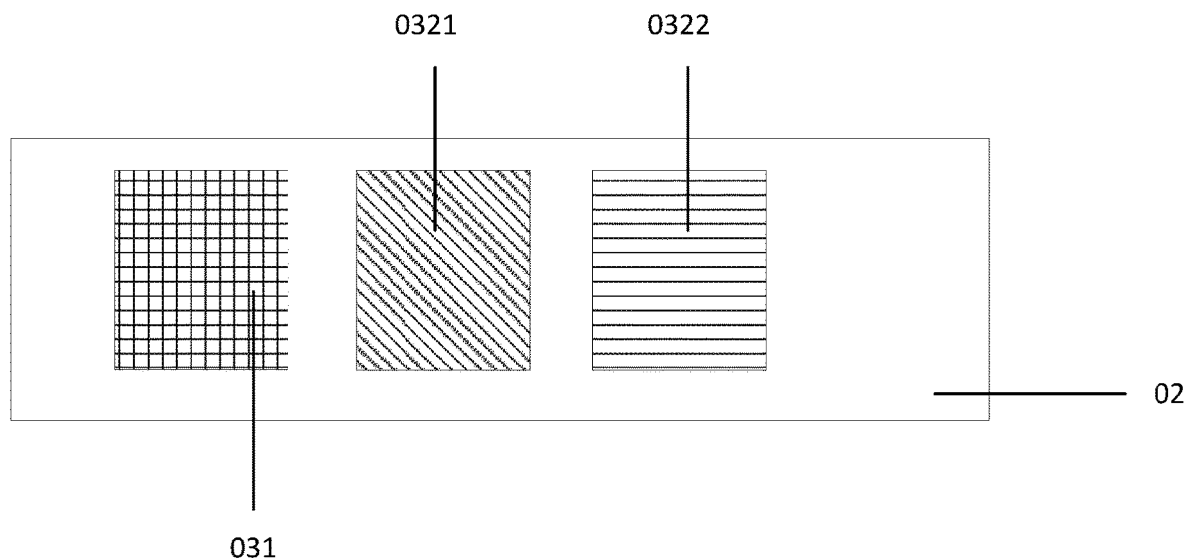
FIG. 4*a* is a schematic diagram of the array substrate in the related art in a top view.
Figure 4B:
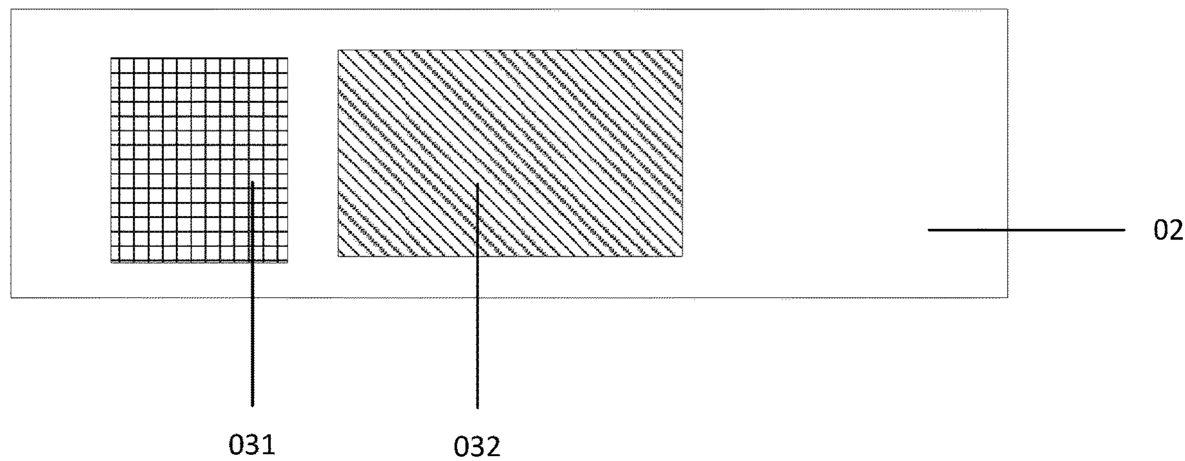
FIG. 4*b* is a schematic diagram of the array substrate according to the embodiment of this disclosure in a top view.

In a conventional fabrication process, sub-pixel light-emitting layers in three colors, i.e., a first sub-pixel light-emitting layer 031, a third sub-pixel light-emitting layer 0321, and a fourth sub-pixel light-emitting layer 0322 as illustrated in FIG. 4*a*, are evaporated on the base substrate 02. In the array substrate above according to the embodiment of this disclosure, only sub-pixel light-emitting layers in two colors are evaporated, and as illustrated in FIG. 4*b*, sub-pixel light-emitting layers in two colors, i.e., the first sub-pixel light-emitting layer 031 and the second sub-pixel light-emitting layer 032, are evaporated on the base substrate 02. As compared with the array substrate as illustrated in FIG. 4*a*, in the array substrate above according to the embodiment of this disclosure, the area of a second sub-pixel light-emitting layer 032 is larger than the area of a third sub-pixel light-emitting layer 0321 or a fourth sub-pixel light-emitting layer 0322, and since there is a larger area of the second sub-pixel light-emitting layer 032, there is also a larger opening area of a fine metal mask corresponding thereto to thereby lower the difficulty of a process of fabricating the fine metal mask, so as to lower the difficulty of the process of fabricating the array substrate. On the other hand, as illustrated in FIG. 3, since the color of the light corresponding to the first sub-pixel light-emitting layer 031 is such color of light with a lower transmittance of an element extracting the light among the color filters, the first sub-pixel light-emitting layer 031 emits the light in the color corresponding thereto through self-emission, that is, the first sub-pixel light-emitting layer 031 is fabricated using a fine metal mask and evaporation to thereby lower the power consumption of the array substrate so as to prolong the service lifetime of the array substrate.

Optionally in a specific implementation, in the array substrate above according to the embodiment of this disclosure, the filter 04_1 can be a red color filter, for example; the filter 04_2 can be a green color filter, for example; and the red color filter and the green color filter are arranged on the second sub-pixel light-emitting layer 032, to extract red light through the red color filter from the light emitted from the second sub-pixel light-emitting layer 032, and green light through the green color filter from the light emitted from the second sub-pixel light-emitting layer 032. Of course, other color filters can alternatively be arranged as needed in reality, although the embodiment of this disclosure will not be limited thereto.

Furthermore in a specific implementation, in the array substrate above according to the embodiment of this disclosure, the first sub-pixel light-emitting layer 031 and the second sub-pixel light-emitting layer 032 can be arranged at the same layer to thereby reduce the thickness of the array substrate.

Furthermore in a specific implementation, in the array substrate above according to the embodiment of this disclosure, as illustrated in FIG. 3, a pixel definition layer 05 is arranged between the first sub-pixel light-emitting layer 031 and the second sub-pixel light-emitting layer 032, so that the light-emitting layers in the different colors are spaced from each other, and insulated from each other.

In a specific implementation, in the array substrate above according to the embodiment of this disclosure, the second sub-pixel light-emitting layer 032 can include a white sub-pixel light-emitting layer or a yellow sub-pixel light-emitting layer. Of course, the second sub-pixel light-emitting layer 032 can include a sub-pixel light-emitting layer in another color as needed in reality, although the embodiment of this disclosure will not be limited thereto.

The structure of the array substrate according to the embodiment of this disclosure will be described below by way of an example only for the purpose of making the principle of this disclosure more apparent, although the embodiment of this disclosure will not be limited thereto.

Figure 5:
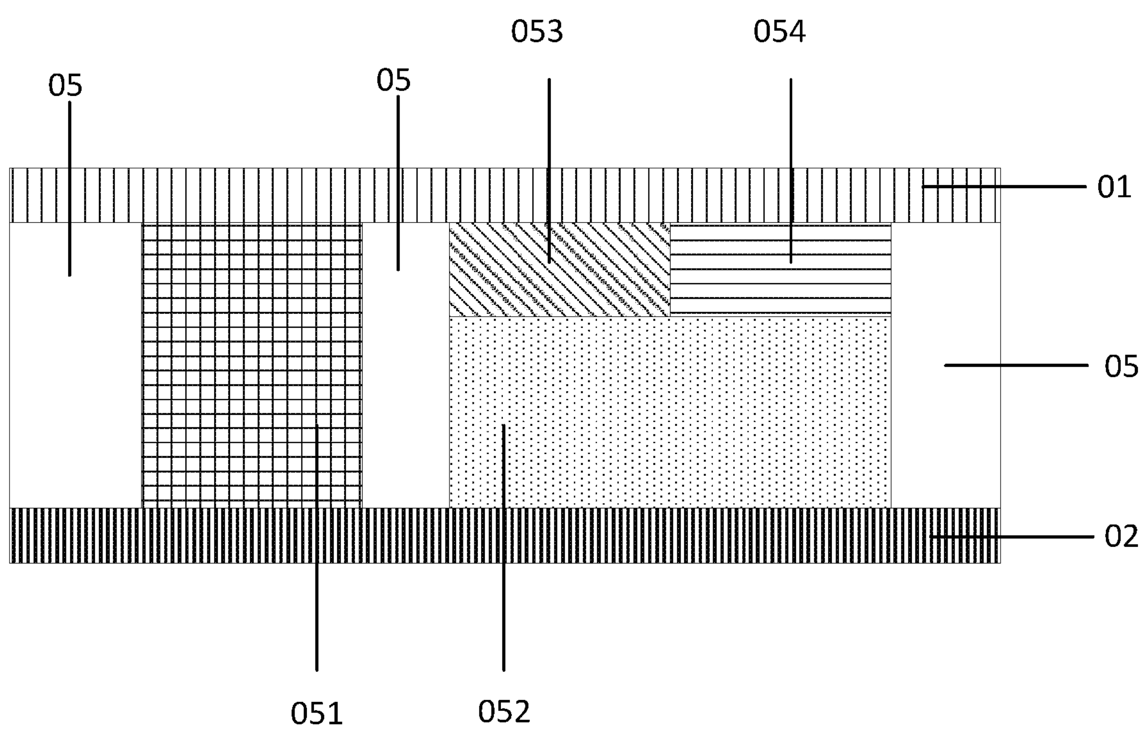
FIG. 5 is a second schematic structural diagram of the array substrate according to the embodiment of this disclosure.

Specifically in some optional implementations, in the array substrate above according to the embodiment of this disclosure, as illustrated in FIG. 5, the array substrate can include sub-pixels in three colors including a red sub-pixel, a blue sub-pixel, and a green sub-pixel. The array substrate can further include: a base substrate 02, and a first sub-pixel light-emitting layer, and a second sub-pixel light-emitting layer, both of which are located on one side of the base substrate 02, where the first sub-pixel light-emitting layer can be a blue sub-pixel light-emitting layer 051, for example, and the second sub-pixel light-emitting layer can be a yellow sub-pixel light-emitting layer 052, for example. Furthermore the blue sub-pixel light-emitting layer 051 and the yellow sub-pixel light-emitting layer 052 can be arranged at the same layer. Pixel definition layer 05 are arranged between the blue sub-pixel light-emitting layer 051 and the yellow sub-pixel light-emitting layer 052 so that the light-emitting layers of different pixels are insulated from each other. Two different color filters are arranged on the side of the yellow sub-pixel light-emitting layer 052 away from the base substrate 02, where of the two different color filters, the first filter can be a red color filter 053, for example, and the second filter can be a green color filter 054, for example; and the orthographic projection of the red color filter 053 and the orthographic projection of the green color filter 054 onto the base substrate 02 overlap with the orthographic projection of the yellow sub-pixel light-emitting layer 052 onto the base substrate 02. In this way, the self-emitting sub-pixel light-emitting layers in the two colors including the blue sub-pixel light-emitting layer 051 and the yellow sub-pixel light-emitting layer 052 are arranged on the base substrate 02, and the red color filter 053 and the green color filter 054 are arranged on the yellow sub-pixel light-emitting layer 052, so that the red color filter 053 extracts red light from yellow light emitted from the yellow sub-pixel light-emitting layer 052 to form a red sub-pixel, and the green color filter 054 extracts green light from the yellow light emitted from the yellow sub-pixel light-emitting layer 052 to form a green sub-pixel. As compared with the use of a fine metal mask, the areas of the color filters in the respective colors can be made smaller, so the red color filter 053 and the green color filter 054 are arranged on the yellow sub-pixel light-emitting layer 052 to extract the red light and the green light, so that the array substrate can be provided with a higher resolution.

Moreover only the sub-pixel light-emitting layers in the two colors including the blue sub-pixel light-emitting layer 051 and the yellow sub-pixel light-emitting layer 052 needs to be evaporated to thereby reduce the number of times a fine metal mask is used, and the number of times the fine metal mask is aligned precisely while the fine metal mask is being used, so as to lower the probability that a color crosstalk may occur between the pixels while the array substrate is being fabricated, and to improve the product quality of the array substrate. Furthermore since there is a larger area of the yellow sub-pixel light-emitting layer 052, there is also a larger opening area of a fine metal mask corresponding thereto to thereby lower the difficulty of a process of fabricating the fine metal mask, so as to lower the difficulty of the process of fabricating the array substrate. On the other hand, since there is a lower transmittance of an element extracting blue light among the color filters, the blue sub-pixel light-emitting layer 051 emits blue light through self-emission, that is, the blue sub-pixel light-emitting layer 051 is fabricated using a fine metal mask and evaporation to thereby lower the power consumption of the array substrate so as to prolong the service lifetime of the array substrate.

In some other optional implementations, in the array substrate above according to the embodiment of this disclosure, as illustrated in FIG. 5, the yellow sub-pixel light-emitting layer 052 can alternatively be a white sub-pixel light-emitting layer, and correspondingly two different color filters are arranged on the side of the white sub-pixel light-emitting layer away from the base substrate 02, where of the two different color filters, the first color filter can be a red color filter 053, for example, and the second color filter can be a green color filter 054, for example; and the self-emitting sub-pixel light-emitting layers in two colors including the blue sub-pixel light-emitting layer 051 and the white sub-pixel light-emitting layer are arranged on the base substrate 02, and the red color filter 053 and the green color filter 054 are arranged on the white sub-pixel light-emitting layer, so that the red color filter 053 extracts red light from white light emitted from the white sub-pixel light-emitting layer to form a red sub-pixel, and the green color filter 054 extracts green light from the white light emitted from the white sub-pixel light-emitting layer to form a green sub-pixel.

Figure 6:
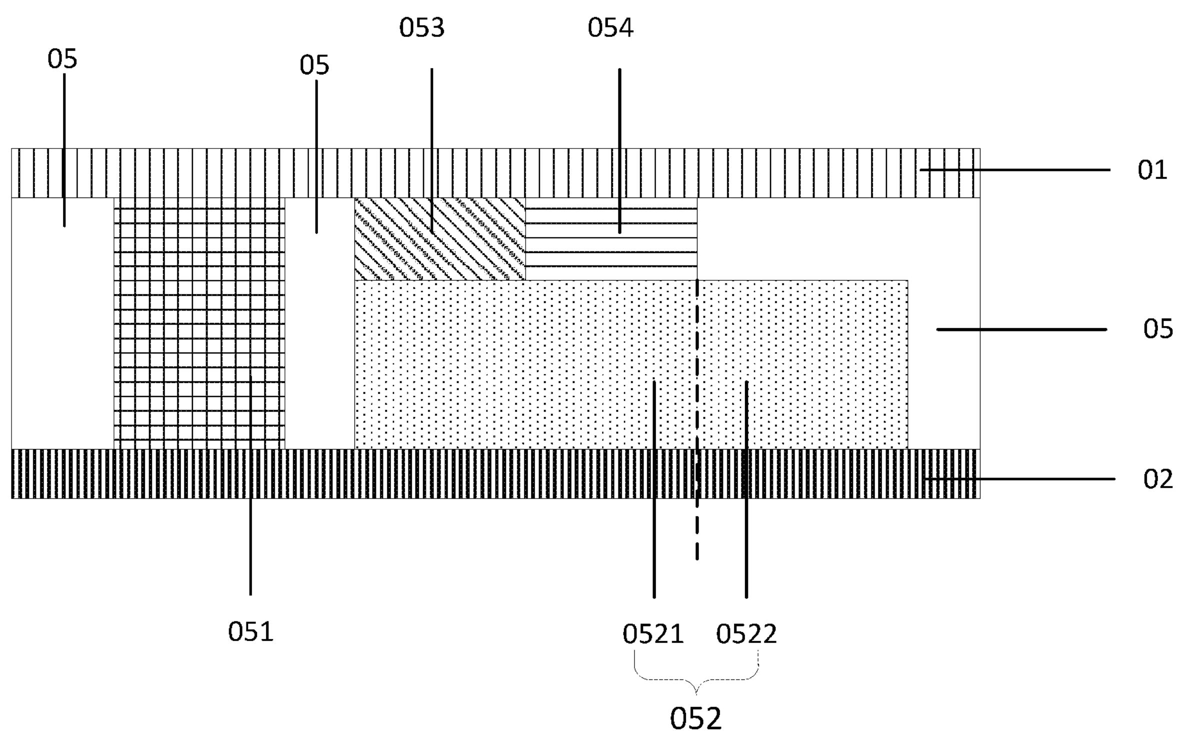
FIG. 6 is a third schematic structural diagram of the array substrate according to the embodiment of this disclosure.

Specifically in some other optional implementations, in the array substrate above according to the embodiment of this disclosure, as illustrated in FIG. 6, the array substrate can include sub-pixels in four colors including a red sub-pixel, a blue sub-pixel, a green sub-pixel, and a yellow sub-pixel. Specifically the array substrate can include: a base substrate 02, and a first sub-pixel light-emitting layer and a second sub-pixel light-emitting layer, both of which are located on one side of the base substrate 02, where the first sub-pixel light-emitting layer can be a blue sub-pixel light-emitting layer 051, for example, and the second sub-pixel light-emitting layer can be a yellow sub-pixel light-emitting layer 052, for example; and the blue sub-pixel light-emitting layer 051 is arranged at the same layer as the yellow sub-pixel light-emitting layer 052, and a pixel definition layer 05 is arranged between the blue sub-pixel light-emitting layer 051 and the yellow sub-pixel light-emitting layer 052 to insulate the light-emitting layers of different pixels are insulated from each other. Furthermore two different color filters are arranged on the side of the sub-pixel light-emitting layer 052 away from the base substrate 02, where the first filter can be a red color filter 053, for example, and the second filter can be a green color filter 054, for example, where the area of the orthographic projection of the yellow sub-pixel light-emitting layer 052 is larger than the sum of the areas of the orthographic projections of the red color filters 053 and the green color filter 054, and the yellow sub-pixel light-emitting layer 052 can include two parts, i.e., a first part 0521 and a second part 0522, where the area of the orthographic projection of the first part 0521 is equal to the sum of the areas of the orthographic projections of the red color filters 053 and the green color filter 054, that is, the orthographic projections of the red color filters 053 and the green color filter 054 overlap with the orthographic projection of the first part 0521 of the yellow sub-pixel light-emitting layer, in the direction perpendicular to the base substrate 02. The second part 0522 of the yellow sub-pixel light-emitting layer is such a part that the orthographic projection of the part does not overlap with the orthographic projections of the red color filter 053 and the green color filter 054, in the direction perpendicular to the base substrate 02, and the second part 0522 of the yellow sub-pixel light-emitting layer emits yellow light through self-emission to form a yellow sub-pixel. The self-emitting sub-pixel light-emitting layers in the two colors including the blue sub-pixel light-emitting layer 051 and the yellow sub-pixel light-emitting layer 052 are arranged on the base substrate 02, and the red color filter 053 and the green color filter 054 are arranged on the yellow sub-pixel light-emitting layer 052, so that the red color filter 053 extracts red light from yellow light emitted from the yellow sub-pixel light-emitting layer 052 to form a red sub-pixel, and the green color filter 054 extracts green light from the yellow light emitted from the yellow sub-pixel light-emitting layer 052 to form a green sub-pixel. As compared with the use of a fine metal mask, the areas of the color filters in the respective colors can be made smaller, so the red color filter 053 and the green color filter 054 are arranged on the yellow sub-pixel light-emitting layer 052 to extract the red light and the green light, so that the array substrate can be provided with a higher resolution.

Moreover only the sub-pixel light-emitting layers in the two colors including the blue sub-pixel light-emitting layer 051 and the yellow sub-pixel light-emitting layer 052 need to be evaporated to thereby reduce the number of times a fine metal mask is used, and the number of times the fine metal mask is aligned precisely while the fine metal mask is being used, so as to lower the probability that a color crosstalk may occur between the pixels while the array substrate is being fabricated, and to improve the product quality of the array substrate. Furthermore since there is a larger area of the yellow sub-pixel light-emitting layer 052, there is also a larger opening area of a fine metal mask corresponding thereto, to thereby lower the difficulty of a process of fabricating the fine metal mask, so as to lower the difficulty of the process of fabricating the array substrate. On the other hand, since there is a lower transmittance of an element extracting blue light among the color filters, the blue sub-pixel light-emitting layer 051 emits blue light through self-emission, that is, the blue sub-pixel light-emitting layer 051 is fabricated using a fine metal mask and evaporation to thereby lower the power consumption of the array substrate so as to prolong the service lifetime of the array substrate.

In some optional implementations, in the array substrate above according to the embodiment of this disclosure, still as illustrated in FIG. 6, the yellow sub-pixel light-emitting layer 052 can alternatively be a white sub-pixel light-emitting layer, and correspondingly the array substrate can include sub-pixels in four colors including a red sub-pixel, a blue sub-pixel, a green sub-pixel, and a white sub-pixel, and two different color filters are arranged on the side of the white sub-pixel light-emitting layer away from the base substrate 02, where the first color filter can be a red color filter 053, for example, and the second color filter can be a green color filter 054, for example, where the area of the white sub-pixel light-emitting layer is larger than the sum of the areas of the red color filters 053 and the green color filter 054, and the white sub-pixel light-emitting layer can include two parts, i.e., a first part and a second part, where the area of first part is equal to the sum of the areas of the red color filters 053 and the green color filter 054, that is, the orthographic projections of the red color filters 053 and the green color filter 054 onto the base substrate 02 overlap with the orthographic projection of the first part of the white sub-pixel light-emitting layer; and the second part of the white sub-pixel light-emitting layer is such a part that the orthographic projection of the part onto the base substrate 02 does not overlap with the orthographic projections of the red color filter 053 and the green color filter 054, and the second part of the white sub-pixel light-emitting layer emits light through self-emission to form a white sub-pixel.

Figure 7:
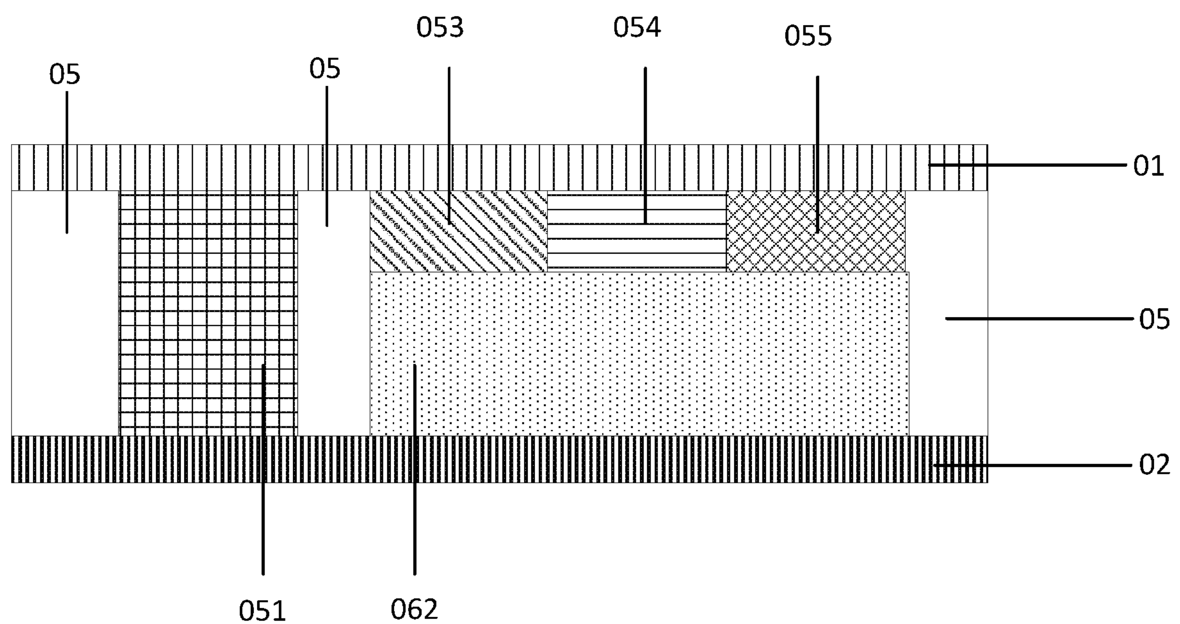
FIG. 7 is a fourth schematic structural diagram of the array substrate according to the embodiment of this disclosure.

Specifically in another optional implementation, in the array substrate above according to the embodiment of this disclosure, as illustrated in FIG. 7, the array substrate includes sub-pixels in four colors including a red sub-pixel, a blue sub-pixel, a green sub-pixel, and a yellow sub-pixel. The array substrate can further include: a base substrate 02, and a first sub-pixel light-emitting layer and a second sub-pixel light-emitting layer, both of which are located on one side of the base substrate 02, where the first sub-pixel light-emitting layer can be a blue sub-pixel light-emitting layer 051, for example, and the second sub-pixel light-emitting layer can be a white sub-pixel light-emitting layer 062, for example; and the blue sub-pixel light-emitting layer 051 is arranged at the same layer as the white sub-pixel light-emitting layer 062, and the pixel definition layer 05 is arranged between the blue sub-pixel light-emitting layer 051 and the white sub-pixel light-emitting layer 062 so that the light-emitting layers of different pixels are insulated from each other. Three different color filters are arranged on the side of the white sub-pixel light-emitting layer 062 away from the base substrate 02, where of the three different color filters, the first filter can be, for example, a red color filter 053, the second filter can be, for example, a green color filter 054, and the third filter can be, for example, a yellow color filter 055; and the orthographic projections of the red color filter 053, the green color filter 054, and the yellow color filter 055 onto the base substrate 02 at least partially overlap with the orthographic projection of the white sub-pixel light-emitting layers 062 onto the base substrate 02. Of course, more different color filters can alternatively be arranged, and FIG. 7 illustrates an example of the embodiment of this disclosure only for the purpose of making the principle of this disclosure more apparent, but is not intended to limit this disclosure thereto. Specifically the different color filters can be arranged as needed in reality.

The self-emitting sub-pixel light-emitting layers in the two colors including the blue sub-pixel light-emitting layer 051 and the white sub-pixel light-emitting layers 062 are arranged on the base substrate 02, and the red color filter 053, the green color filter 054, and the yellow color filter 055 are arranged on the white sub-pixel light-emitting layers 062, so that the red color filter 053 extracts red light from white light emitted from the white sub-pixel light-emitting layers 062 to form a red sub-pixel, the green color filter 054 extracts green light from the white light emitted from the white sub-pixel light-emitting layers 062 to form a green sub-pixel, and the yellow color filter 055 extracts yellow light from the white light emitted from the white sub-pixel light-emitting layers 062 to form a yellow sub-pixel. As compared with the use of a fine metal mask, the areas of the color filters in the respective colors can be made smaller, so the red color filter 053, the green color filter 054, and the yellow color filter 055 are arranged on the white sub-pixel light-emitting layers 062 to extract the red light, the green light, and the yellow light, so that the array substrate can be provided with a higher resolution.

Moreover only the sub-pixel light-emitting layers in the two colors including the blue sub-pixel light-emitting layer 051 and the white sub-pixel light-emitting layers 062 need to be evaporated to thereby reduce the number of times a fine metal mask is used, and the number of times the fine metal mask is aligned precisely while the fine metal mask is being used, so as to lower the probability that a color crosstalk may occur between the pixels while the array substrate is being fabricated, and to improve the product quality of the array substrate. Furthermore since there is a larger area of the white sub-pixel light-emitting layers 062, there is also a larger opening area of a fine metal mask corresponding thereto, to thereby lower the difficulty of a process of fabricating the fine metal mask so as to lower the difficulty of the process of fabricating the array substrate. On the other hand, since there is a lower transmittance of an element extracting blue light among the color filters, the blue sub-pixel light-emitting layer 051 emits blue light through self-emission, that is, the blue sub-pixel light-emitting layer 051 is fabricated using a fine metal mask and evaporation to thereby lower the power consumption of the array substrate so as to prolong the service lifetime of the array substrate.

Furthermore the specific structure of the array substrate according to the embodiment of this disclosure can be designed as needed in reality, and since the specific structure of the array substrate shall occur to those ordinarily skilled in the art, a repeated description thereof will be omitted here, and the embodiment of this disclosure will not be limited thereto.

Furthermore in the array substrate above according to the embodiment of this disclosure, the base substrate can be a glass cover plate, for example, or of course, can be another layer structure, as needed in reality, although the embodiment of this disclosure will not be limited thereto.

It shall be noted that when the array substrate according to the embodiment of this disclosure is applied to a display device, the display device can further include an opposite substrate 01 arranged opposite to the base substrate 02 as illustrated in FIG. 3, FIG. 5, and FIG. 7. Furthermore in the structure of the array substrate as illustrated in FIG. 3, FIG. 5, and FIG. 7, only a position relationship between the opposite substrate 01 and the base substrate 02 is illustrated, and their specific structures may not be limited to the layer structures as illustrated, but can be designed as needed in reality, although the embodiment of this disclosure will not be limited thereto.

Furthermore in a specific implementation, in the array substrate above according to the embodiment of this disclosure, the second sub-pixel light-emitting layer includes a host material and a dopant material. The host material is used to suppress the concentration quenching of the dopant material, and transfer the energy to the dopant material. The dopant material has characteristics of high luminous efficiency, and is used to emit light in a desirable color. Specific components of the host material and the dopant material can be designed as needed in reality, and since the specific components of the host material and the dopant material shall occur to those ordinarily skilled in the art, a repeated description thereof will be omitted here, and the embodiment of this disclosure will not be limited thereto.

Furthermore in a specific implementation, in the array substrate above according to the embodiment of this disclosure, the host material includes a host material in at least one color, and correspondingly the dopant material includes a dopant material in at least one color.

In a specific implementation, when the second sub-pixel light-emitting layer include the yellow sub-pixel light-emitting layer, the yellow sub-pixel light-emitting layer includes a yellow host material and a yellow dopant material, for example.

Alternatively the yellow sub-pixel light-emitting layer can emit yellow light from a mixture of a red emitting material and a green emitting material, so the yellow sub-pixel light-emitting layer can include a red emitting material and a green emitting material, for example, where the red emitting material can include a red host material and a red dopant material, and the green emitting material can include a green host material and a green dopant material. Of course, the materials of the second sub-pixel light-emitting layers will not be limited thereto, but can be designed as needed in reality without departing from the spirit of this disclosure, although the embodiment of this disclosure will not be limited thereto.

Figure 8:
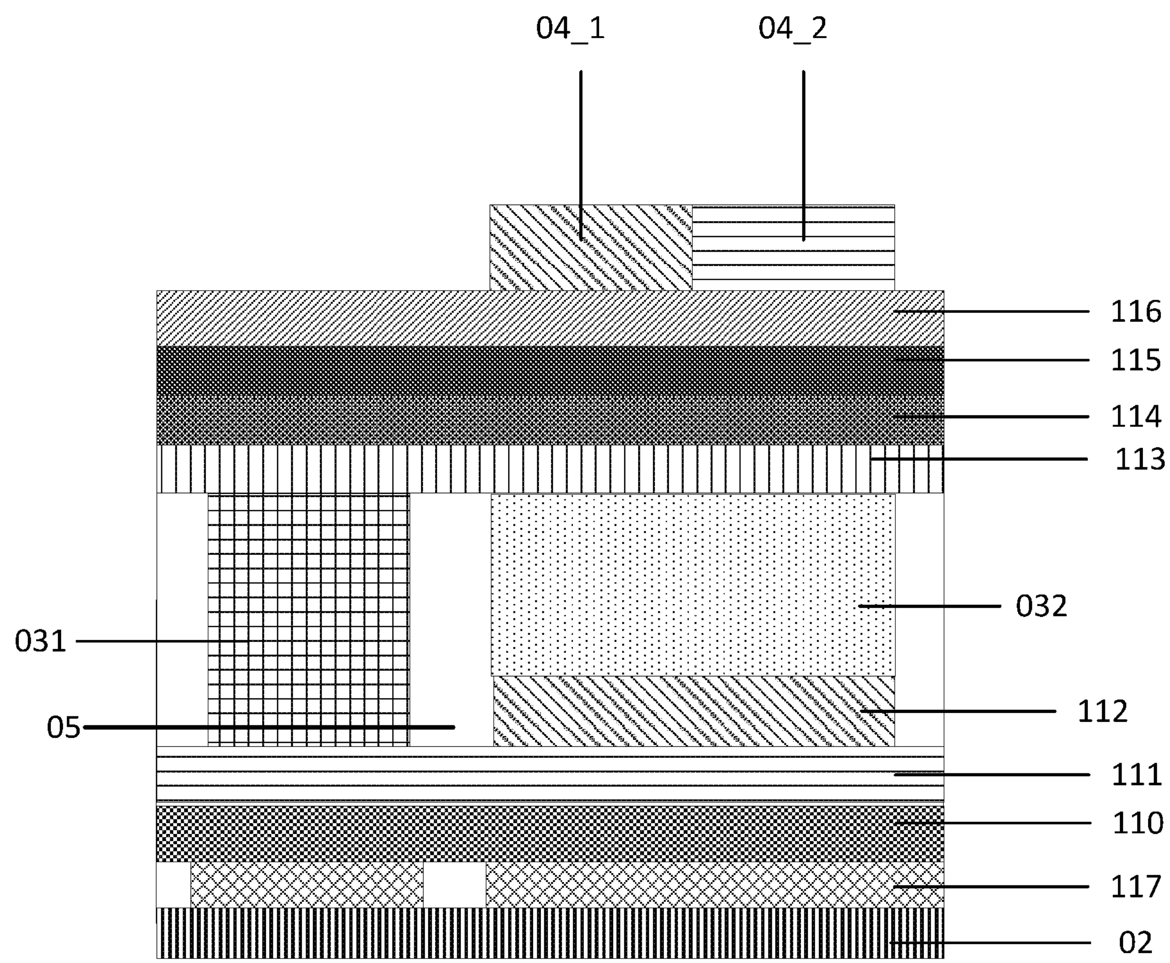
FIG. 8 is a schematic structural diagram in details of the array substrate according to the embodiment of this disclosure.

Furthermore in a specific implementation, in the array substrate above according to the embodiment of this disclosure as illustrated in FIG. 8, the array substrate can further include: a first electrode layer 115 located between the color filters 04_*m* and the second sub-pixel light-emitting layer 032, and a second electrode layer 117 located between the base substrate 02 and the second sub-pixel light-emitting layer 032. The first electrode layer 115 can be a cathode layer, and the second electrode layer 117 can be an anode layer, so that corresponding voltage can be applied respectively to the first electrode layer 115 and the second electrode layer 117 to drive the light-emitting layers in the different colors to emit light.

Furthermore the material of the first electrode layer 115 can be a transparent conductive material including metal or tin indium oxide, for example, as needed in reality, although the embodiment of this disclosure will not be limited thereto. The material of the second electrode layer 117 can be a transparent conductive material including tin indium oxide, for example, as needed in reality, although the embodiment of this disclosure will not be limited thereto.

Furthermore in a specific implementation, in the array substrate above according to the embodiment of this disclosure, as illustrated in FIG. 8, the array substrate can further include an optical coupling layer 116 located between the first electrode 115 and the color filters 04_*m*. Since the light emitted from the light-emitting layers in the different colors, e.g., the second sub-pixel light-emitting layer 032, may be reflected in the layer structure of the array substrate, and thus results in light loss, the optical coupling layer 116 can be arranged to further extract the light emitted from the second sub-pixel light-emitting layer 032 to thereby improve the luminous efficiency of the second sub-pixel light-emitting layer 032.

Furthermore in a specific implementation, in the array substrate above according to the embodiment of this disclosure, as illustrated in FIG. 8, the array substrate can further include: an electron injection layer 114 located between the first electrode layer 115 and the second sub-pixel light-emitting layer 032, an electron transport layer 113 located between the electron injection layer 114 and the second sub-pixel light-emitting layer 032, a hole injection layer 110 located between the second electrode layer 117 and the second sub-pixel light-emitting layer 032, and a hole transport layer 111 located between the hole injection layer 110 and the second sub-pixel light-emitting layer 032. Furthermore the array substrate can further include an optical adjusting layer 112 located between the second sub-pixel light-emitting layer 032 and the hole transport layer 111. The orthographic projection of the optical adjusting layer 112 onto the base substrate 02 overlaps with the orthographic projection of the second sub-pixel light-emitting layer 032 onto the base substrate 02. Furthermore the optical adjusting layer 112 is located below the second sub-pixel light-emitting layer 032, and configured to adjust Chromaticity Coordinate (CIE) of the light emitted from the second sub-pixel light-emitting layer 032. Since the spectrum of the second sub-pixel light-emitting layer 032 is different from the spectrum of the first sub-pixel light-emitting layer 031, they need to be optically adjusted differently, so optical adjusting layer may not be arranged for the first sub-pixel light-emitting layer 031, or of course, optical adjusting layer or other layer structure may be arranged, as needed in reality.

Furthermore in a specific implementation, in the array substrate above according to the embodiment of this disclosure, as illustrated in FIG. 8, the optical coupling layer 116, the electron injection layer 114, the electron transport layer 113, the hole injection layer 110, the hole transport layer 111, and the optical adjusting layer 112 are made of an organic material, or of course, they can be made of another material, as needed in reality, although the embodiment of this disclosure will not be limited thereto.

Based upon the same inventive idea, an embodiment of this disclosure further provides a display device including the array substrate above according to the embodiment of this disclosure. Reference can be made to the embodiment of the array substrate above for an implementation of the display device, and a repeated description thereof will be omitted here.

In a specific implementation, the display device according to the embodiment of this disclosure can be a mobile phone, a tablet computer, a TV set, a display, a notebook computer, a digital camera, a navigator, or any other product or component with a display function. All the other components indispensable to the display device shall readily occur to those ordinarily skilled in the art, and a repeated description thereof will be omitted here, although the embodiment of this disclosure will not be limited thereto.

Figure 9:
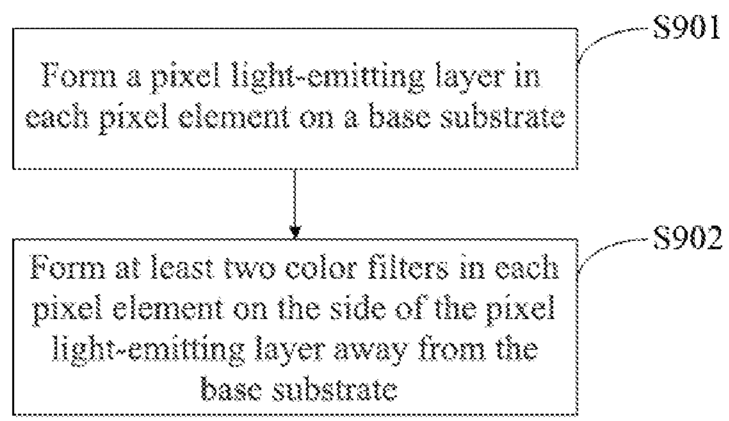
FIG. 9 is a first flow chart of a method for fabricating an array substrate according to an embodiment of this disclosure.

Based upon the same inventive idea, an embodiment of this disclosure provides a method for fabricating an array substrate, and as illustrated in FIG. 9, the method can include the following steps.

The step S901 is to form a pixel light-emitting layer in each pixel element on a base substrate, where the pixel light-emitting layer includes a first sub-pixel light-emitting layer and a second sub-pixel light-emitting layer.

The step S902 is to form at least two different color filters in each pixel element on the side of the pixel light-emitting layer away from the base substrate, where in the same pixel element, the orthographic projection of each of the filters onto the base substrate has an overlap area with the orthographic projection of the second sub-pixel light-emitting layer onto the base substrate.

In a specific implementation, the step of forming the pixel light-emitting layer includes at least the steps of fabricating the first sub-pixel light-emitting layer, and fabricating the second sub-pixel light-emitting layer.

Figure 10:
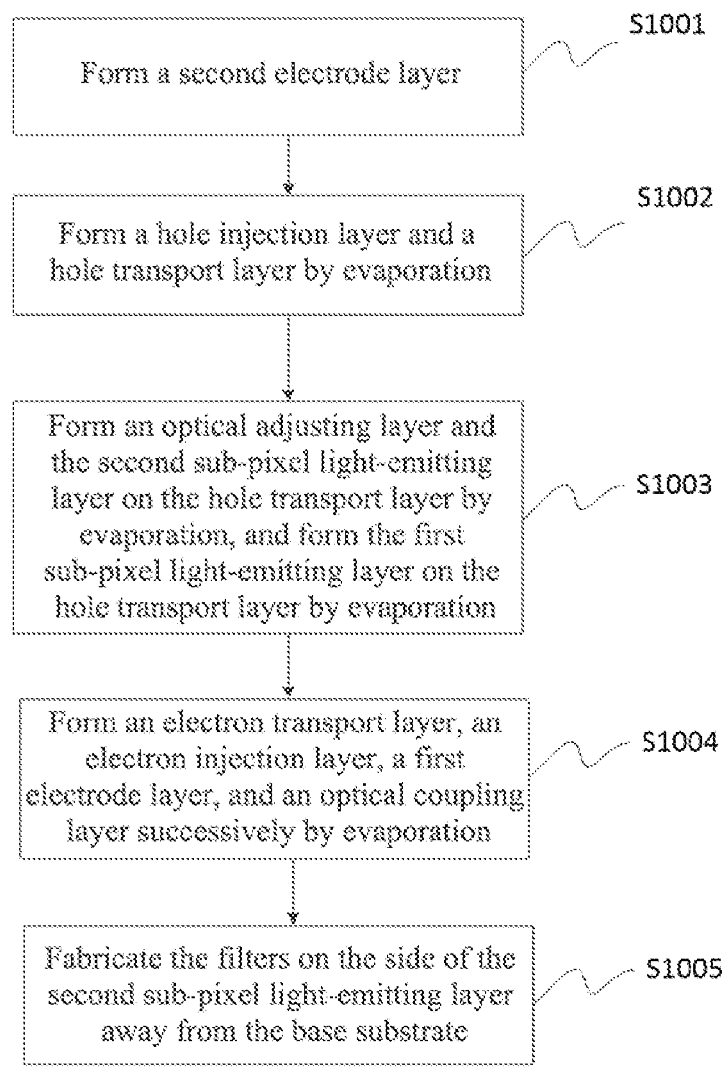
FIG. 10 is a second flow chart of a method for fabricating the array substrate according to the embodiment of this disclosure.

As illustrated in FIG. 10, specific steps of the method for fabricating an array substrate according to the embodiment of this disclosure are as follows.

The step S1001 is to form a second electrode layer in each of the pixel elements on one side of the base substrate through sputtering. The second electrode layer can be made of tin indium oxide, for example. The base substrate is formed before the step S1001.

The step S1002 is to form a hole injection layer and a hole transport layer successively on the second electrode layer by evaporation using a mask with an opening, where the hole injection layer and the hole transport layer can be made of an organic material, for example.

The step S1003 is form an optical adjusting layer and the second sub-pixel light-emitting layer successively on the hole transport layer by evaporation using a fine metal mask, and to form the first sub-pixel light-emitting layer on the hole transport layer 111, where the optical adjusting layer can be made of an organic material, for example, and the first sub-pixel light-emitting layer and the second sub-pixel light-emitting layer can be made of a host material and a dopant material, for example.

The step S1004 is to form an electron transport layer, an electron injection layer, a first electrode layer, and an optical coupling layer successively on the first sub-pixel light-emitting layer and the second sub-pixel light-emitting layer by evaporation using a mask with an opening, where the electron transport layer, the electron injection layer, and the optical coupling layer can be made of an organic material, for example.

The step S1005 is to fabricate the filters on the side of the second sub-pixel light-emitting layer away from the base substrate. An opposite substrate can be further formed after the step S1005.

In the array substrate, the method for fabricating the same, and the display device above according to the embodiments of this disclosure, the resolution of the array substrate is improved using the filters to thereby lower the probability that a color crosstalk may occur between the pixels while the array substrate is being fabricated, so as to lower the difficulty of the process of fabricating the array substrate, and to improve the product quality of the array substrate. Furthermore the power consumption of the array substrate including the self-emitting pixels is lowered to thereby prolong the service lifetime of the array substrate so as to provide the array substrate with both a high definition and lower power consumption.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. An array substrate, comprising:

a base substrate; and a plurality of pixel elements located on one side of the base substrate, wherein:

each of the pixel elements comprises: a pixel light-emitting layer, and at least two different color filters located on a side of the pixel light-emitting layer away from the base substrate;

the pixel light-emitting layer comprises a first sub-pixel light-emitting layer and a second sub-pixel light-emitting layer; and in a same pixel element, an orthographic projection of each of the filters onto the base substrate has an overlap area with an orthographic projection of the second sub-pixel light-emitting layer onto the base substrate;

wherein the second sub-pixel light-emitting layer is a yellow sub-pixel light-emitting layer; and the yellow sub-pixel light-emitting layer consists of:

a yellow host material and a yellow dopant material; or a red emitting material and a green emitting material;

wherein the first sub-pixel light-emitting layer is arranged at a same layer as the second sub-pixel light-emitting layer; and a pixel definition layer is arranged between the first sub-pixel light-emitting layer and the second sub-pixel light-emitting layer.

2. The array substrate according to claim 1, wherein the red emitting material consists of a red host material and a red dopant material, and the green emitting material consists of a green host material and a green dopant material.

3. The array substrate according to claim 1, wherein the first sub-pixel light-emitting layer is a blue sub-pixel light-emitting layer.

4. The array substrate according to claim 1, wherein the filters comprise a red color filter and a green color filter.

5. The array substrate according to claim 1, wherein orthographic projections of the filters onto the base substrate do not overlap each other.

6. The array substrate according to claim 5, wherein in the same pixel element, the orthographic projection of the second sub-pixel light-emitting layer onto the base substrate covers the orthographic projection of each of the filters onto the base substrate.

7. The array substrate according to claim 1, further comprising: a first electrode layer located between the filters and the second sub-pixel light-emitting layer, and a second electrode layer located between the base substrate and the second sub-pixel light-emitting layer.

8. The array substrate according to claim 7, further comprising an optical coupling layer located between the first electrode layer and the filters.

9. The array substrate according to claim 7, further comprising: an electron injection layer located between the first electrode layer and the second sub-pixel light-emitting layer, an electron transport layer located between the electron injection layer and the second sub-pixel light-emitting layer, a hole injection layer located between the second electrode layer and the second sub-pixel light-emitting layer, and a hole transport layer located between the hole injection layer and the second sub-pixel light-emitting layer.

10. The array substrate according to claim 9, further comprising an optical adjustment layer located between the second sub-pixel light-emitting layer and the hole transport layer.

11. A display device, comprising the array substrate according to claim 1.

12. A method for fabricating the array substrate according to claim 1, the method comprising:

forming the pixel light-emitting layer in each pixel element on the base substrate, wherein the pixel light-emitting layer comprises the first sub-pixel light-emitting layer and the second sub-pixel light-emitting layer; and forming at least two different color filters on the side of the pixel light-emitting layer away from the base substrate in each pixel element, wherein in a same pixel element, the orthographic projection of each of the filters onto the base substrate has the overlap area with the orthographic projection of the second sub-pixel light-emitting layer onto the base substrate;

wherein said forming the pixel light-emitting layer comprises:

forming the first sub-pixel light-emitting layer in a first evaporation process; and forming the second sub-pixel light-emitting layer in a second evaporation process.

* * * * *